(12) United States Patent
Hasegawa et al.

(10) Patent No.: US 6,973,234 B2
(45) Date of Patent: Dec. 6, 2005

(54) OPTICAL CIRCUIT FOR CONDENSING LASER BEAMS, AND LIGHT SOURCE DEVICE

(75) Inventors: Kazuo Hasegawa, Nishin (JP); Tadashi Ichikawa, Nagoya (JP); Hiroyuki Matsubara, Seto (JP); Mitsutoshi Maeda, Aichi-gun (JP); Hiroshi Ito, Kasugai (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 16 days.

(21) Appl. No.: 10/445,915

(22) Filed: May 28, 2003

(65) Prior Publication Data
US 2003/0223685 A1 Dec. 4, 2003

(30) Foreign Application Priority Data
May 29, 2002 (JP) .............................. 2002-155318

(51) Int. Cl.$^7$ ................................. G02B 6/26
(52) U.S. Cl. .............................. 385/31; 385/39; 385/43
(58) Field of Search ............................. 385/24, 31, 33, 385/39, 43, 129, 132

(56) References Cited

U.S. PATENT DOCUMENTS

| | | | |
|---|---|---|---|
| 5,127,068 A | 6/1992 | Baer et al. | |
| 5,410,625 A | 4/1995 | Jenkins et al. | |
| 5,729,643 A | 3/1998 | Hmelar et al. | |
| 5,852,692 A | 12/1998 | Nightingale et al. | |
| 5,949,931 A * | 9/1999 | Kitamura | 385/28 |
| 2002/0126479 A1 * | 9/2002 | Zhai et al. | 362/244 |

FOREIGN PATENT DOCUMENTS

| | | |
|---|---|---|
| EP | 0 424 913 | 5/1991 |
| EP | 0 893 719 | 1/1999 |
| JP | 5-93828 | 4/1993 |
| JP | 7-168040 | 7/1995 |
| JP | 2000-19362 | 1/2000 |
| JP | 2000-352637 | 12/2000 |

* cited by examiner

*Primary Examiner*—Sarah Song
(74) *Attorney, Agent, or Firm*—Oblon, Spivak, McClelland, Maier & Neustadt, P.C.

(57) ABSTRACT

Each of guided beam incident portions of an optical waveguide device includes a straight incidence area where laser beams enter, a curved area which curves the laser beams entering from the straight incidence area in a predetermined direction, and a widening tapered area which makes the laser beams that have passed through the curved area parallel or substantially parallel to a propagation direction of the laser beams by decreasing propagation angles of the laser beams.

6 Claims, 8 Drawing Sheets

FIG. 2
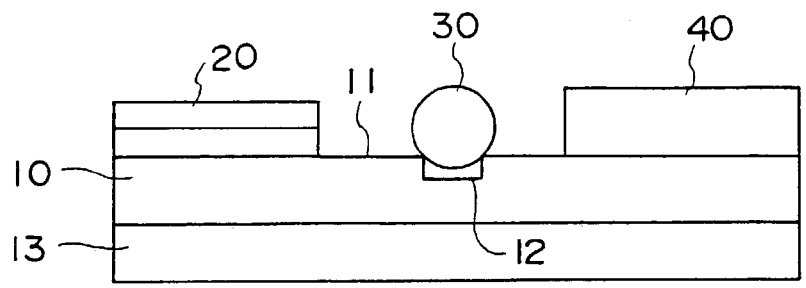
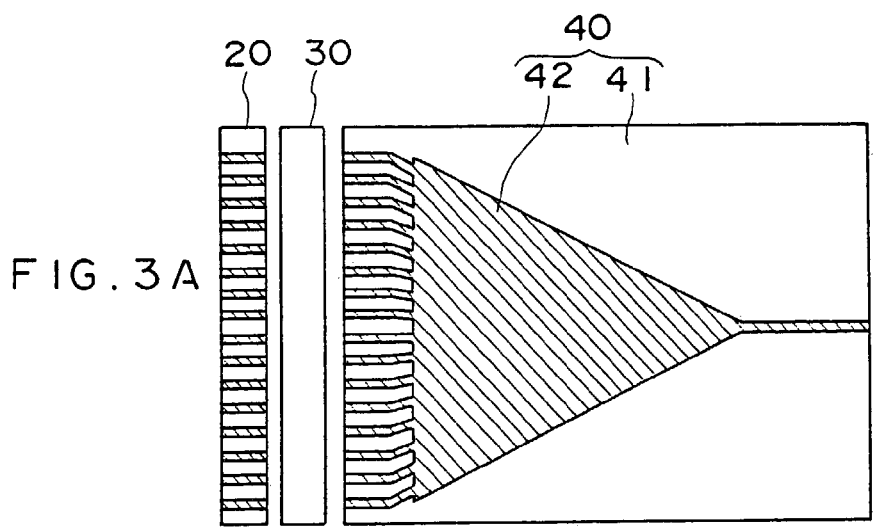
FIG. 3A
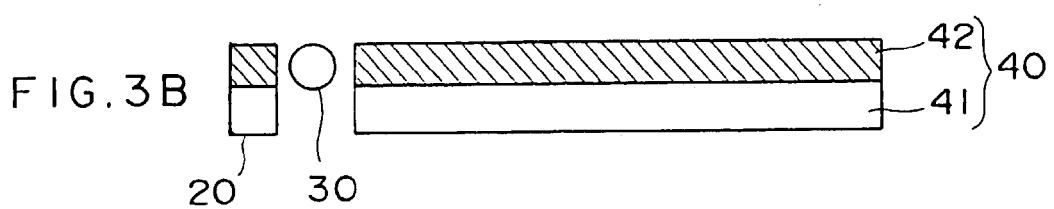
FIG. 3B

WIDTH W5 OF END OF
NARROWING TAPERED AREA

OPTICAL CIRCUIT FOR CONDENSING LASER BEAMS, AND LIGHT SOURCE DEVICE

CROSS-REFERENCE TO RELATED APPLICATION

This application claims priority under 35USC 119 from Japanese Patent Application No. 2002-155318, the disclosure of which is incorporated by reference herein.

BACKGROUND OF THE INVENTION

1. Field of the Invention

The present invention relates to an optical circuit for condensing laser beams and a light source device, and more specifically to an optical circuit for condensing laser beams and a light source device which are suitable for use in a semiconductor laser beam machine that carries out direct diode laser beam machining and a pumping source of a pumped solid-state laser.

2. Description of the Related Art

A Y-type multiplexing circuit has been conventionally proposed as an optical circuit for condensing laser beams emitted from an arrayed light source.

FIG. 14 is a plan view of a conventional Y-type multiplexing circuit. Many of laser beams entering the Y-type multiplexing circuit are beyond critical angles and deviate from waveguides at connection points where the circuit is connected to the waveguides. Therefore, a loss of about 2 to 3 dB is caused every time incident laser beams pass through a connection point. For this reason, a problem arises in that, even if the number of the connection points of the Y-type multiplexing circuit is increased in order to condense a large number of laser beams emitted from an arrayed light source, the strength of an output of the Y-type multiplexing circuit is not very high.

Japanese Patent Application Laid-Open (JP-A) No. 5-93828 proposes a "device for condensing laser diodes of a multiple emitter to a multi-mode optical fiber" (hereinafter referred to as "related art 1"). The related art 1 attempts to condense laser beams at high density by making emission surfaces 12, 14 and 16 of a laser diode bar 10 respectively correspond to optical fibers 18, 20 and 22 of an optical fiber bundle 24 as shown in FIG. 1 of the related art 1.

However, since the laser diode bar 10 includes a large number of emission surfaces, it is very troublesome to connect an optical fiber to each of all of the emission surfaces. Further, the number of optical fibers which can be connected to all of the emission surfaces is limited. Therefore, even when laser beams are condensed by connecting the optical fibers to the emission surfaces, the condensed laser beams have a limited energy density.

Moreover, it is desirable that the optical fiber bundle has a small outer diameter in order to make a light condensing system compact. However, when an attempt is made to condense laser beams emitted from many emission surfaces, the outer diameter of the optical fiber bundle 24 becomes large. Thus, it becomes difficult to condense laser beams in practice.

JP-A No. 7-168040 proposes a device for condensing semiconductor lasers (hereinafter referred to as "related art 2"). The related art 2 includes, as shown in FIG. 2 thereof, semiconductor lasers (a laser bar) $1b$ having a plurality of stacked light sources, an optical branching device $2b_1$ for condensing laser beams, which have been respectively emitted from the semiconductor laser $1b$, in a transverse direction, and an optical branching device $2b_2$ for condensing laser beams, which have exited from the optical branching device $2b_1$, in a longitudinal direction.

However, in the related art 2, it is necessary to align laser beam-emitting positions of the laser bar $1b$ with laser beam-entering positions of the optical branching device $2b_1$ at high accuracy in order to adjust optical axes of laser beams. Moreover, even after the adjustment of the optical axes, it is difficult to maintain the positions of the laser bar $1b$, and the optical branching devices $2b_1$ and $2b_2$. For this reason, misalignment of the connecting positions of the respective components is easily caused, and therefore, it is difficult to condense laser beams efficiently.

JP-A No. 2000-19362 proposes a condensing device for arrayed semiconductor lasers (hereinafter referred to as "related art 3"). The condensing device includes a condenser 10 for condensing laser beams emitted from light-emitting portions of arrayed semiconductor lasers.

However, the related art 3 has a problem in that, with an increase in the number of semiconductor lasers, the condenser 10 becomes too long in a longitudinal direction thereof (i.e., a direction parallel to a direction in which laser beams enter) to have practical dimensions. In order to shorten the longitudinal direction length of the condenser 10, it is necessary to steeply curve waveguides formed inside the condenser 10. However, a problem arises in that steeply curving the waveguides leads to an increase in a radiation loss of the laser beams.

SUMMARY OF THE INVENTION

The present invention has been proposed in order to solve the above-described problems. An object of the present invention is to provide an optical circuit for condensing laser beams and a light source device which multiplexes at high efficiency a plurality of laser beams emitted from arrayed light sources.

A first aspect of the present invention is an optical circuit for condensing laser beams, the optical circuit comprising: a plurality of guided beam incident portions, each of the guided beam incident portions comprising an incidence port through which laser beams enter and a collimating portion which is optically connected to the incidence port and makes the incident laser beams parallel or substantially parallel to a propagation direction of the laser beams; and a guided beam exiting portion comprising a narrowing tapered portion, which has an inlet end optically connected to the plurality of guide beam incident portions and an outlet end and narrowingly tapers from the inlet end towards the outlet end, and an exit port provided at the outlet end of the narrowing tapered portion.

The guided beam incident portions each include an incidence port and a collimating portion. The incidence port is a portion where laser beams enter. The collimating portion serves to make the laser beams parallel to or substantially parallel to a propagation direction of the laser beams by decreasing propagation angles of the laser beams. The collimating portion may include a widening tapered portion or may be a curved waveguide which directs the laser beams toward a condensing point of the laser beams.

The guided beam exiting portion includes a narrowing tapered portion and an exit port. The narrowing tapered portion is optically connected to the collimating portion of each of the guided beam incident portions. The narrowing tapered portion multiplexes the laser beams exiting from the collimating portions, and the multiplexed laser beams exit to the outside through the exit port.

Therefore, according to the first aspect of the present invention, the laser beams can be condensed at high efficiency by collimating or substantially collimating the laser beams in the collimating portion by decreasing the propagation angles of the laser beams, and then multiplexing the collimated laser beams at high efficiency.

Further, in the first aspect of the present invention, the collimating portion may include a widening tapered portion which has an inlet end and an outlet end and narrowingly tapers from the outlet end towards the inlet end. In this case, propagation angles of the laser beams which have entered the widening tapered portion become smaller after repeated internal reflections, whereby the laser beams are collimated or substantially collimated.

Thus, according to the first aspect of the present invention, the laser beams can be multiplexed at high efficiency because the widening tapered portion of each of the guided beam incident portions makes the laser beams having small propagation angles enter the narrowing tapered portion. A combination of a straight beam-guiding portion, a curved beam-guiding portion and a narrowing tapered portion, or a beam-guiding portion formed by connecting a narrowing tapered portion and a straight beam-guiding portion may be provided at the outlet end side of the widening tapered portion.

A second aspect of the present invention is an optical circuit for condensing laser beams, the optical circuit comprising: a plurality of guided beam incident portions, each of the guided beam incident portions comprising an incidence port through which laser beams enter and a waveguide for changing propagation angle which is optically connected to the incidence port and changes propagation angles of the incident laser beams; and a guided beam exiting portion comprising a first narrowing tapered portion, which has an inlet end optically connected to the plurality of guide beam incident portions and an outlet end and narrowingly tapers from the inlet end towards the outlet end, and an exit port provided at the outlet end of the first narrowing tapered portion.

Therefore, according to the second aspect of the present invention, the laser beams can be condensed at high efficiency by decreasing the propagation angles of the laser beams in the waveguide for changing propagation angle and multiplexing the laser beams exiting from the waveguide for changing propagation angle.

A third aspect of the present invention is a light source device comprising: an optical circuit for condensing laser beams; an arrayed light source which emits laser beams to a plurality of incidence ports of the optical circuit for condensing laser beams; an optical fiber optically connected to a guided beam exiting portion of the optical circuit for condensing laser beams; and a condenser lens for condensing the laser beams exiting from the optical fiber.

The arrayed light source is not particularly limited to a semiconductor laser array as long as it is structured to, for example, control a divergence angle. The arrayed light source emits laser beams from a plurality of light emitting portions such that the emitted laser beams enter the incidence ports of the optical circuit for condensing laser beams. The optical circuit for condensing laser beams multiplexes the laser beams emitted from the arrayed light source and outputs the laser beams through the exit port. The laser beams exiting from respective optical circuits for condensing laser beams advance via optical fibers and are condensed by the condenser lens.

Therefore, according to the third aspect of the present invention, the optical circuit for condensing laser beams decreases the propagation angles of the laser beams emitted from the arrayed light source, multiplexes the laser beams, and outputs the multiplexed laser beams to the outside via the optical fibers and the condenser lens. Accordingly, bright laser beams condensed at high efficiency can be output to the outside.

In the first to third aspects of the present invention, the beam-guiding portion may be formed by an optical waveguide or other optical system or optical transmission line such as an optical fiber. When the beam-guiding portion is formed by an optical waveguide, the narrowing tapered portion is formed so that a width thereof decreases in a propagation direction of the laser beams. As a result, a beam-guiding area of the narrowing tapered portion decreases. In the case of the widening tapered portion, a beam-guiding area thereof is increased by increasing a width of a waveguide in the propagation direction of the laser beams.

BRIEF DESCRIPTION OF THE DRAWINGS

FIG. 2 is an enlarged cross-sectional view of a semiconductor laser array, a rod lens, and an optical waveguide device disposed on a Si substrate.

FIG. 3A is a plan view of the semiconductor laser array, the rod lens, and the optical waveguide device.

FIG. 3B is a cross-sectional view of the semiconductor laser array, the rod lens, and the optical waveguide device.

DESCRIPTION OF THE PREFERRED EMBODIMENTS

Preferred embodiments of the present invention will be described in detail below with reference to the drawings.

Figure 1:
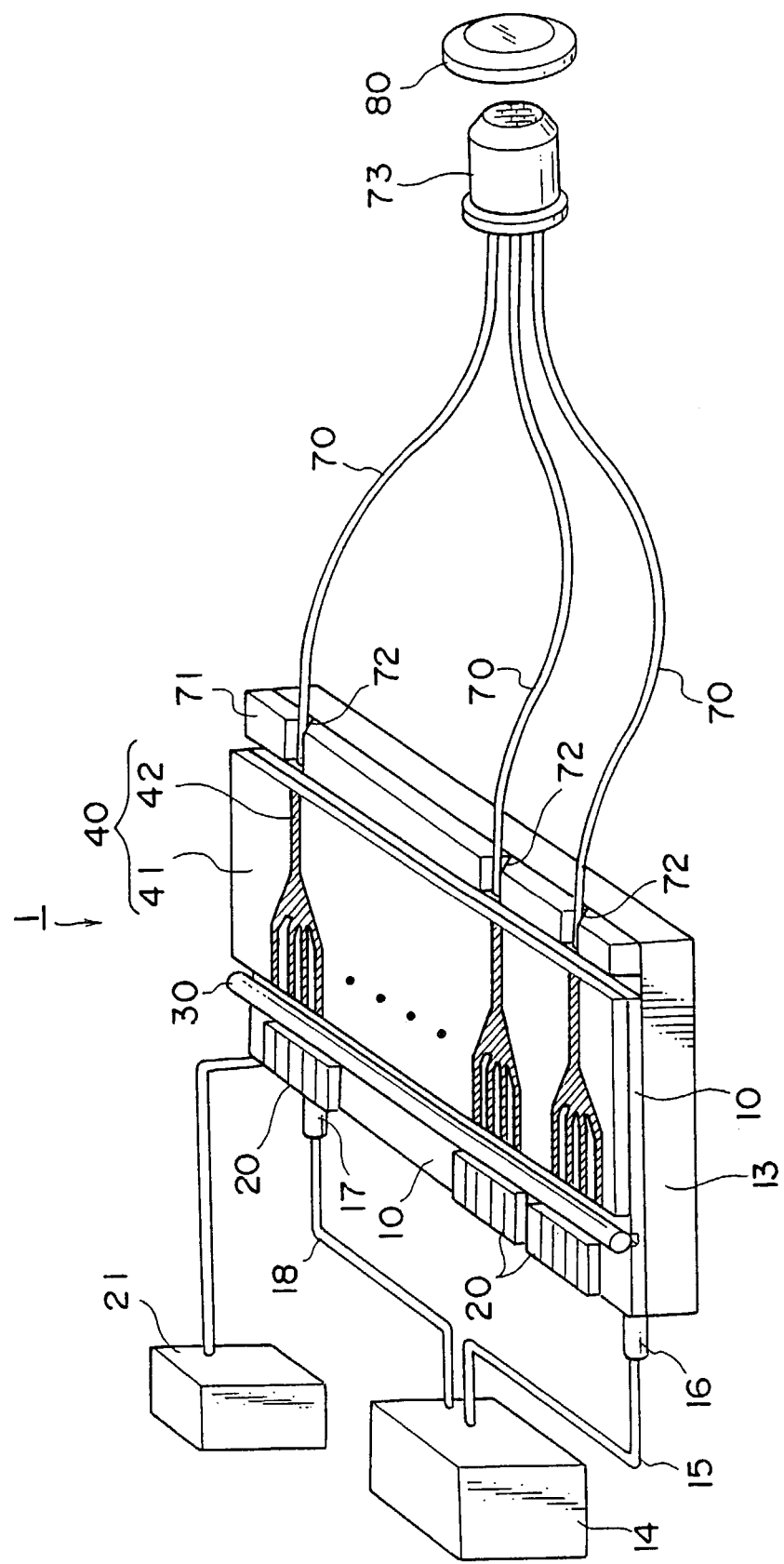
FIG. 1 is a perspective view showing the structure of a light source device for a semiconductor laser according to an embodiment of the present invention.

FIG. 1 is a perspective view showing the structure of a light source device 1 for a semiconductor laser according to an embodiment of the present invention.

The light source device 1 for a semiconductor laser includes semiconductor laser arrays 20, a rod lens 30, a plurality of optical waveguide devices 40, a plurality of optical fibers 70, and a condenser lens 80. The semiconductor laser arrays 20 are disposed on a Si substrate 10 and respectively emit a plurality of laser beams. The rod lens 30 condenses the laser beams emitted from the semiconductor laser arrays 20 in a direction of a fast axis. The optical waveguide devices 40 multiplex the laser beams from the rod lens 30. The optical fibers 70 guide the laser beams multiplexed at the optical waveguide devices 40. The condenser lens 80 condenses the laser beams exiting from the optical fibers 70 and adjusts a focal point.

The Si substrate 10 is precisely formed in a plate shape by a microfabrication process. The Si substrate 10 precisely regulates the heights of the semiconductor laser arrays 20 and the optical waveguide devices 40 disposed on a principal surface 11.

FIG. 2 is an enlarged cross-sectional view of the semiconductor laser array 20, the rod lens 30, and the optical waveguide device 40 disposed on the Si substrate 10.

A groove 12 is formed at the principal surface 11 of the Si substrate 10 between the semiconductor array 20 and the optical waveguide device 40 along a direction in which laser sources of the semiconductor laser array 20 are arranged. The groove 12 has a width that is smaller than the diameter of the rod lens 30. The rod lens 30 is disposed on the groove 12 such that the position of the rod lens 30 is regulated.

The Si substrate 10 is preferably heat-conductive. As shown in FIG. 1, the Si substrate 10 is directly cooled by a plate-shaped cooling substrate 13. The cooling substrate 13 includes therein unillustrated channels for passing refrigerant therethrough. A refrigerant feeder 14 feeds refrigerant to the cooling substrate 13 through a refrigerant hose 15 and a refrigerant inlet/outlet port 16. The refrigerant feeder 14 recovers used refrigerant through an outlet port 17 and a refrigerant hose 18 and feeds refrigerant to the cooling substrate 13 again. In this way, the cooling substrate 13 can always cool the Si substrate 10. Although the cooling substrate 13 used herein is of a water-cooling type which uses refrigerant to cool the Si substrate 10, the cooling substrate 13 may be of an air-cooling type which uses a cooling fin to cool the Si substrate 10.

The semiconductor laser arrays 20 are disposed on the Si substrate 10 at predetermined intervals along the direction in which the laser sources of the semiconductor laser arrays 20 are arranged. Each of the semiconductor arrays 20 is driven by electricity supplied from a power supply 21 and emits laser beams from a plurality of laser beam emitting portions in the same direction. Divergence angles of the laser beams are $\theta\perp$ to 40° in the direction of the fast axis and $\theta//$ to 10° in a direction of a slow axis, which are common characteristics.

As shown in FIG. 2, the position of the rod lens 30 is regulated by the groove 12 formed at the Si substrate 10. The rod lens 30 converges the laser beams emitted from the semiconductor laser arrays 20 in the fast axis direction and makes the laser beams enter the optical waveguide devices 40.

As for the fast axis direction, the laser beams emitted from the semiconductor laser array 20 are converged by the rod lens 30 and easily condensed at the optical waveguide device 40 at high efficiency. As for the slow axis direction, the laser beams are condensed at high efficiency without using a lens by shortening a distance between the semiconductor laser array 20 and the optical waveguide device 40 in consideration of the divergence angle in the slow axis direction. A condensing efficiency of 95% or more can be obtained by coating the rod lens 30 and a surface of an incident end of the optical waveguide device 40 with a anti-reflective material such as a multi-layer dielectric film.

FIG. 3A is a plan view of the semiconductor laser array 20, the rod lens 30, and the optical waveguide device 40, and FIG. 3B is a cross-sectional view thereof.

The optical waveguide device 40 includes $SiO_2$ as a cladding material and $SiO_2$ with $GeO_2$ added thereto as a core material. The optical waveguide device 40 has a step-index structure in the present embodiment. The optical waveguide device 40 is formed by an optical waveguide substrate 41 formed in a flat-plate shape and an optical waveguide 42.

Figure 4:
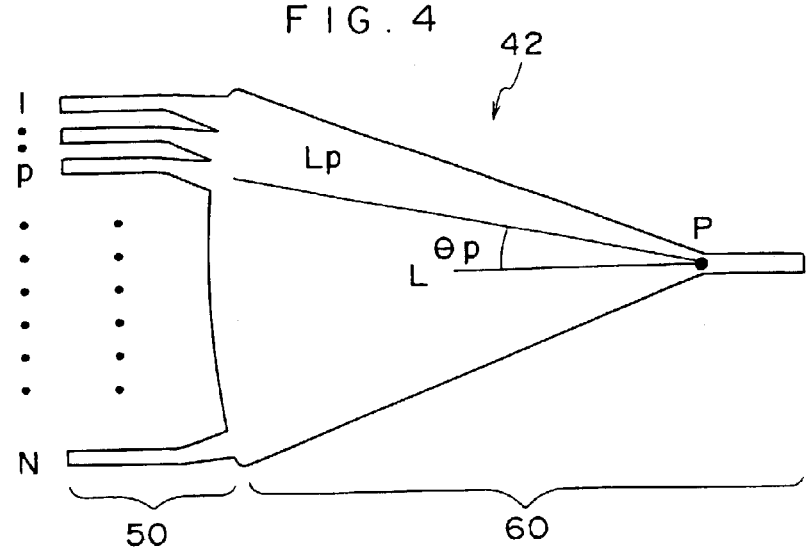
FIG. 4 is a plan view showing the structure of an optical waveguide formed at the optical waveguide device.

FIG. 4 is a plan view showing the structure of the optical waveguide 42 formed at the optical waveguide device 40. The optical waveguide 42 is formed by N number of guided beam incident portions 50 and a guided beam exiting portion 60.

In the guided beam exiting portion 60, it is assumed that a point where the laser beams are condensed is a condensing point P and a straight line Lp (p=1, 2, ... , N) extends from the condensing point P to a central portion of an end of each guided beam incident portion 50 at the side of the guided beam exiting portion. Further, it is assumed that an angle θp is formed by the straight line Lp and a straight line L which is an axis of symmetry of the guided beam exiting portion 60.

Figure 5:
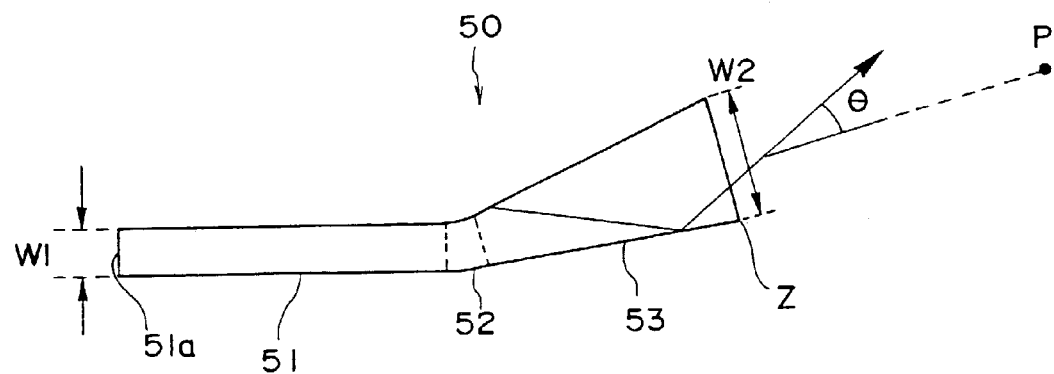
FIG. 5 is a plan view specifically showing the structure of a guided beam incident portion of the optical waveguide.

FIG. 5 is a plan view specifically showing the structure of the guided beam incident portion 50. The guided beam incident portions 50 are disposed so as to be symmetrical to each other with respect to the straight line L shown in FIG. 4. The guided beam incident portion 50 forms a bundle of parallel or substantially parallel laser beams by decreasing propagation angles of the laser beams. The guided beam incident portion 50 includes a straight incidence area 51 where the laser beams enter, a curved area 52 which curves the laser beams entering from the straight incidence area 51 in a predetermined direction, and a widening tapered area 53 which collimates the laser beams which have passed through the curved area 52.

The straight incidence area 51 is a straight waveguide having a substantially uniform width W1. The straight incidence area 51 is formed so as to correspond to each of the laser beam emitting portions of the semiconductor laser array 20. An end of the straight incidence area 51 is an incidence port 51a on which laser beams emitted from the semiconductor array 20 are made incident.

The number of the incidence ports 51a provided is the same as the number of the laser beam emitting portions of the semiconductor laser array 20. In the present embodiment, N (=1, 2, ... , N) number of the incidence ports 51a are present. N number of the straight incidence areas 51 are formed so as to be parallel to each other. The other end of the straight incidence area 51 is connected to the curved area 52.

The curved area 52 is formed between the straight incidence area 51 and the widening tapered area 53. The curved area 52 is a curved waveguide having the substantially uniform width W1. The curved area 52 serves to direct the laser beams, which have entered from the straight incidence area 51, towards the condensing point P. Accordingly, the curved area 52 has a straight portion which is on a symmetrical axis of the guided beam incident portion 50 and a curved portion, an angle of the curve of which increases with an increase in distance from the symmetrical axis.

The widening tapered area 53 is a waveguide having a width which increases from W1 to W2 at a constant rate along a propagation direction of the laser beams. Therefore, the widening tapered area 53 collimates the laser beams by gradually decreasing the propagation angle θ of the laser beams which have entered from the curved area 52 (i.e., the angle formed by the propagation direction and a direction in which the laser beam actually advances). Hereinafter, it is assumed that a divergence angle extended from the propagation angle θ of the laser beam at the end of the widening tapered area 53 is an angle θa.

Figure 6:
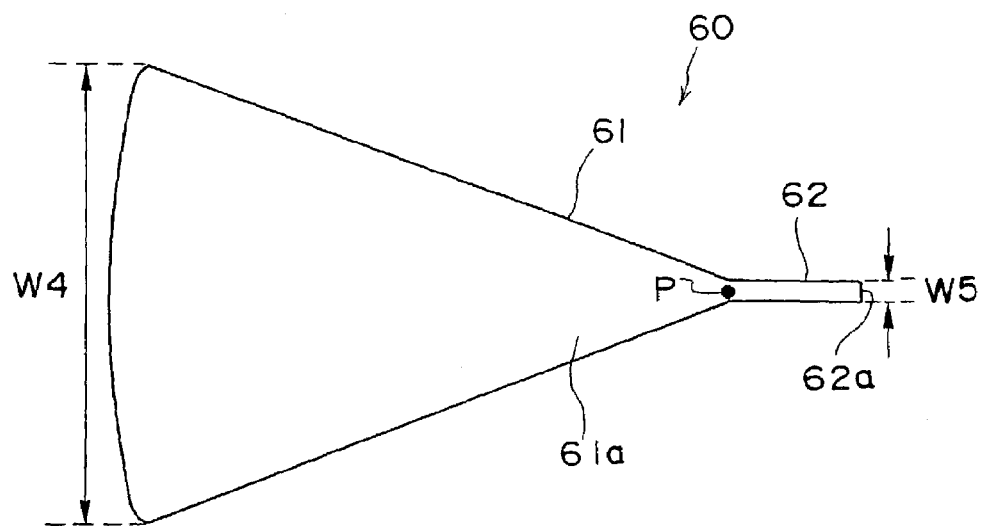
FIG. 6 is a plan view specifically showing the structure of a guided beam exiting portion of the optical waveguide.

FIG. 6 is a plan view specifically showing the structure of the guided beam exiting portion 60. The guided beam exiting portion 60 includes a narrowing tapered area 61 which condenses the laser beams entering from the respective widening tapered areas 53 and a straight exit area 62 through which the condensed laser beams are output to the outside.

The narrowing tapered area 61 is a waveguide having a fan-shaped slab area 61a. The slab area 61a is formed so that a width thereof decreases from W4 to W5 at a constant rate along the propagation direction of the laser beams. An arc portion of the narrowing tapered area 61 is a portion where the laser beams enter and is connected to the N number of the widening tapered areas 53. An angle-of-circumference portion of the narrowing tapered area 61 is a portion where the laser beams are condensed and output. In the present embodiment, the angle-of-circumference portion is connected to the straight incidence area 62.

As shown in FIG. 6, the narrowing tapered area 61 condenses the laser beams which have entered from the respective widening tapered areas 53 and outputs the laser beams through the straight exit area 62. The laser beams which have entered the narrowing tapered area 61 from the widening tapered areas 53 are condensed after repeated internal reflections thereof in the slab area 61a, regardless of the size of the divergence angle θa. Condensing efficiency will be described below.

The straight exit area 62 is a waveguide having a uniform width W5. One end of the straight exit area 62 is connected to the condensing point P, and the other end is an exit port 62a through which the laser beams exit.

Figure 7:
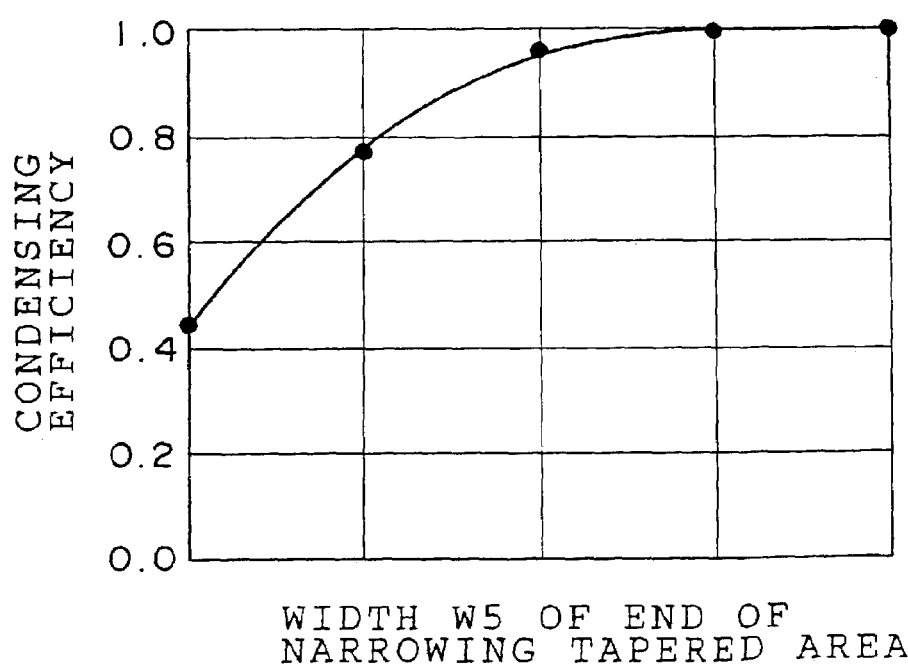
FIG. 7 is a view showing the results of measurement of condensing efficiency with respect to a width W5 of an end of a narrowing tapered area.

FIG. 7 is a view showing the results of measurement of condensing efficiency with respect to the width W5 of the end of the narrowing tapered area 61. The condensing efficiency shown in FIG. 7 is generally obtained, although the condensing efficiency may vary according to the divergence angles of the laser beams, a focal length and arrangement of the rod lens 30, refractive indices of a core region and a cladding region, and the like. For practical reasons, it is preferable that the width W5 of the end of the narrowing tapered area 61 is set so that the condensing efficiency is sufficiently large. According to FIG. 7, the larger the width W5 of the end of the narrowing tapered area 61 is, the larger the condensing efficiency becomes. When the width W5 is three times as large as the width W1, the condensing efficiency becomes about 1.0 and reaches saturation.

Satisfactory effects can be obtained when the divergence angle θa extended from the propagation angle θ of the laser beam at an end (exit end) Z of the widening tapered area 53 satisfies a relationship of $|\theta a|<|\theta p|max<\theta cr$ (p=1, ..., N).

In the relationship, $|\theta p|max$ is a maximum value of θp (p=1, ..., N), and θcr is a critical angle determined by the configuration and refractive index characteristics of the narrowing tapered area 61. Although it is preferable that the above relationship is satisfied for all of p=1, ..., N, no substantial effect is caused even when the above relationship is not satisfied for several (e.g., one or two) of p=1, ..., N.

As the laser beams entering the N number of the incidence ports 51a lose this characteristic one by one, the condensing efficiency decreases slowly.

The optical waveguide device 40 having the above-described structure can condense the laser beams at high efficiency by decreasing the propagation angles θ of the laser beams at the widening tapered area 53 so as to collimate the laser beams and multiplexing the laser beams in the narrowing tapered area 61.

The number of the optical fibers 70 provided is the same as the number of the straight exit areas 62 of the optical waveguide device 40. As shown in FIG. 1, a laser beam incident end of each of the optical fibers 70 is fixed by an optical fiber holding member 71.

The optical fiber holding member 71 is provided at the principal surface 11 of the Si substrate 10 at the side of the exit port of the straight exit area 62 of the optical waveguide device 40. A V-shaped groove 72 is formed in the optical fiber holding member 71 along an optical axis of the laser beams exiting from the exit port. Three-dimensional alignment of the optical axis between the optical waveguide device 40 and the optical fiber 70 becomes unnecessary by aligning an end of the optical fiber 70 at the laser beam incident side with the V-shaped groove 72.

As shown in FIG. 1, a laser beam exiting end of the optical fiber 70 is bound by a fiber bundle 73. The laser beams exiting from the optical fibers 70 are condensed by the condenser lens 80 so as to be irradiated onto a workpiece or an object to be crystallized by laser.

As described above, the light source device 1 for a semiconductor laser according to the present embodiment can condense laser beams, which have been emitted from the semiconductor laser array 20, at high efficiency by decreasing the propagation angles θ of the laser beams by the optical waveguide device 40 in order to form substantially parallel laser beams and then multiplexing the laser beams.

Further, since the semiconductor laser array 20 is fabricated very accurately by a microfabrication process used for fabrication of semiconductor elements, the semiconductor laser array 20 can be easily connected to the incidence ports 51a of the optical waveguide device 40, which is fabricated by a similar microfabrication process. Therefore, the light source device 1 for a semiconductor laser enables very accurate positional adjustment by using passive alignment and can condense laser beams at high efficiency.

Other Embodiments of Optical Waveguide Device 40

The present invention is not limited to the above embodiment, and various design modifications are possible within the scope of the invention. In the following description, components which are similar to those of the above embodiment are designated by the same reference numerals, and detailed description thereof will be omitted.

Figure 8:
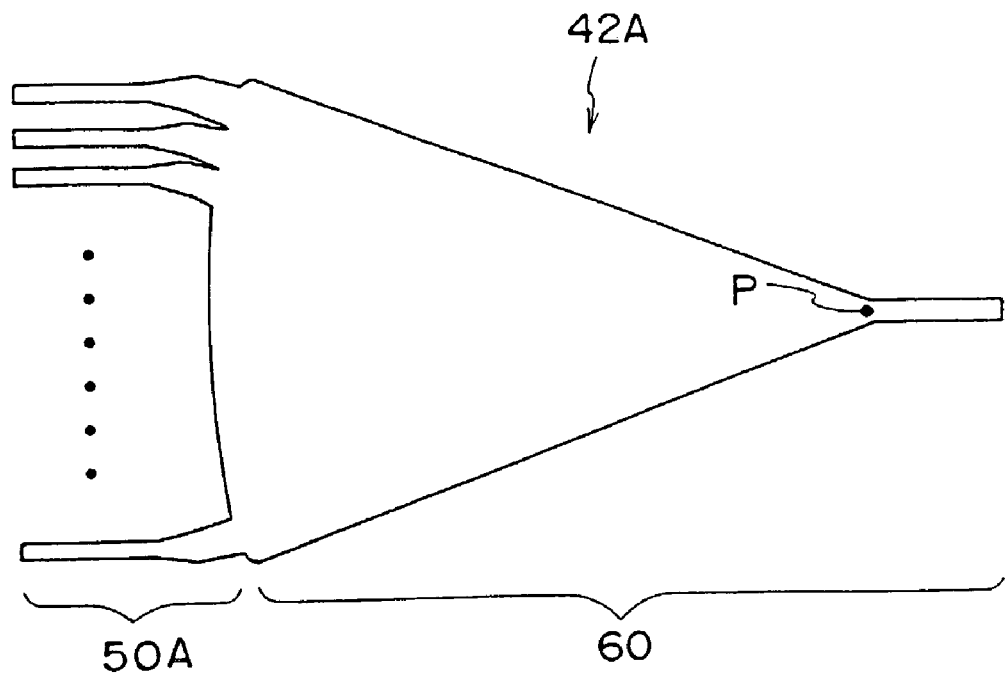
FIG. 8 is a plan view showing the structure of another optical waveguide formed at the optical waveguide device.

FIG. 8 is a plan view showing the structure of another optical waveguide 42A formed at the optical waveguide device 40. The optical waveguide 42A is formed by N number of guided beam incident portions 50A and the guided beam exiting portion 60.

Figure 9:
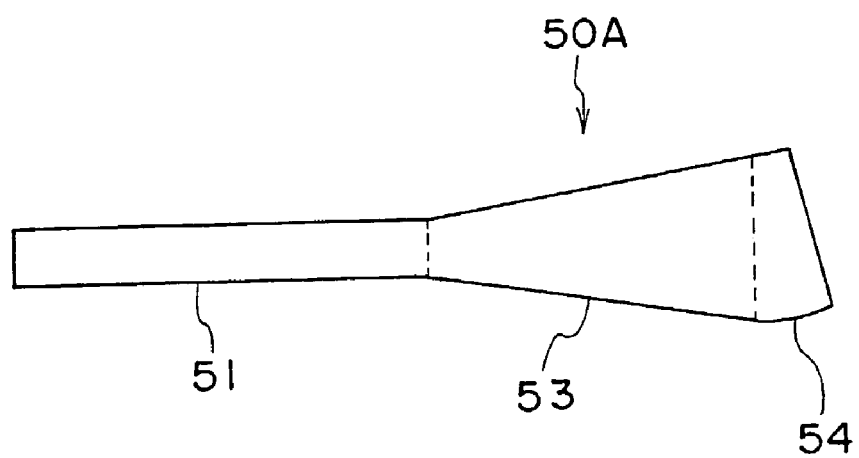
FIG. 9 is a plan view specifically showing the structure of a guided beam incident portion of the another optical waveguide.

FIG. 9 is a plan view specifically showing the structure of the guided beam incident portion 50A. The guided beam incident portion 50A includes the straight incidence area 51 where the laser beams enter, the widening tapered area 53 which collimates the laser beams which have passed through the straight incidence area 51, and a curved area 54 which curves the laser beams entering from the widening tapered area 53 in a predetermined direction.

Namely, the guided beam incident portion 50A is formed by switching the positions of the curved area 52 and the widening tapered area 53 in FIG. 5. Moreover, the curved area 54 serves to direct the laser beams, which have been collimated in the widening tapered area 53, towards the condensing point P. The curved area 54 has a straight portion which is on a symmetrical axis of the guided beam incident portion 50A and a curved portion, an angle of the curve of which increases with an increase in distance from the symmetrical axis.

The optical waveguide device 40 having the above structure decreases the distribution of the divergence angles of the laser beams in the curved area 54 and then multiplexes the laser beams in the narrowing tapered area 61. Therefore, the optical waveguide device 40 can condense laser beams at high efficiency.

Figure 10:
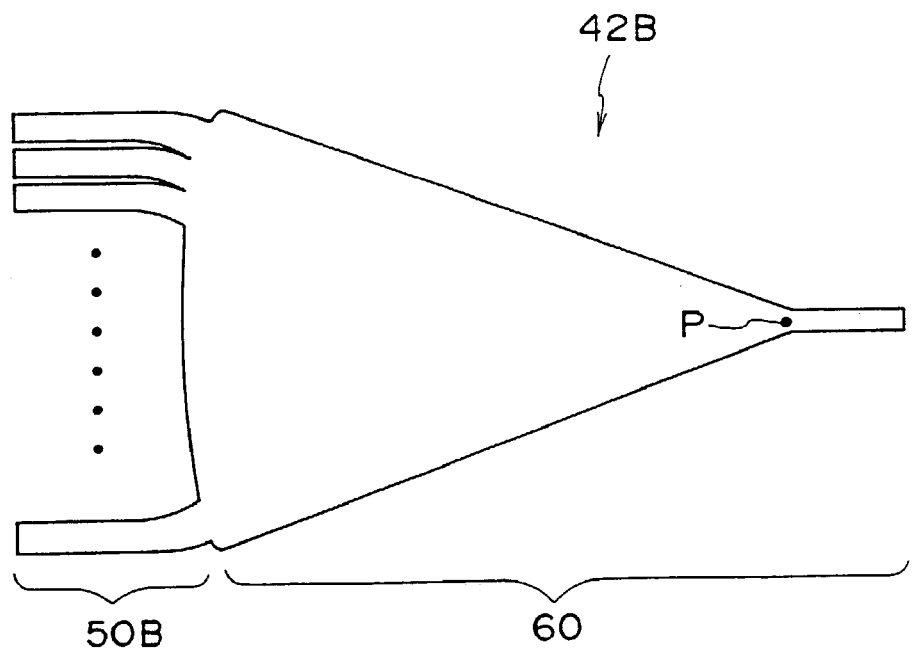
FIG. 10 is a plan view showing the structure of another optical waveguide formed at the optical waveguide device.

FIG. 10 is a plan view showing the structure of another optical waveguide 42B formed at the optical waveguide device 40. The optical waveguide 42B is suitably used with the semiconductor laser array 20 which emits laser beams having small divergence angles $\theta//$ in a direction of a slow axis thereof. The optical waveguide 42B is formed by N number of guided beam incident portions 50B and the guided beam exiting portion 60.

The guided beam incident portion 50B includes the straight incidence area 51 where the laser beams enter, and the curved area 52 which curves the laser beams entering from the straight incidence area 51 in a predetermined direction. Namely, the guided beam incident portion 50B has the structure shown in FIG. 5 with the widening tapered area 53 excluded therefrom.

When the divergence angles $\theta//$ of laser beams in the slow axis direction are small, the optical waveguide device 40 having no widening tapered area 53 can condense the laser beams at equally high efficiency as in the above embodiments by changing the propagation direction of the laser beams towards the condensing point P in the curved area 52.

Figure 11:
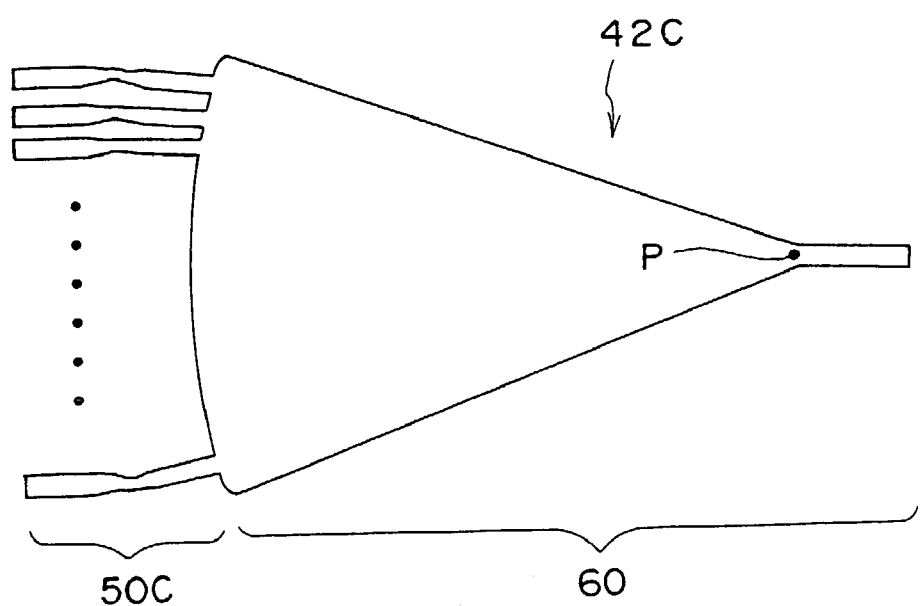
FIG. 11 is a plan view showing the structure of another optical waveguide formed at the optical waveguide device.

FIG. 11 is a plan view showing the structure of another optical waveguide 42C formed at the optical waveguide device 40. The optical waveguide 42C is suitably used when incidence angles of laser beams in the straight incidence area are larger than the divergence angles of the laser beams emitted from the semiconductor laser array 20. The optical waveguide 42C is formed by N number of guided beam incident portions 50C and the guided beam exiting portion 60.

Figure 12:
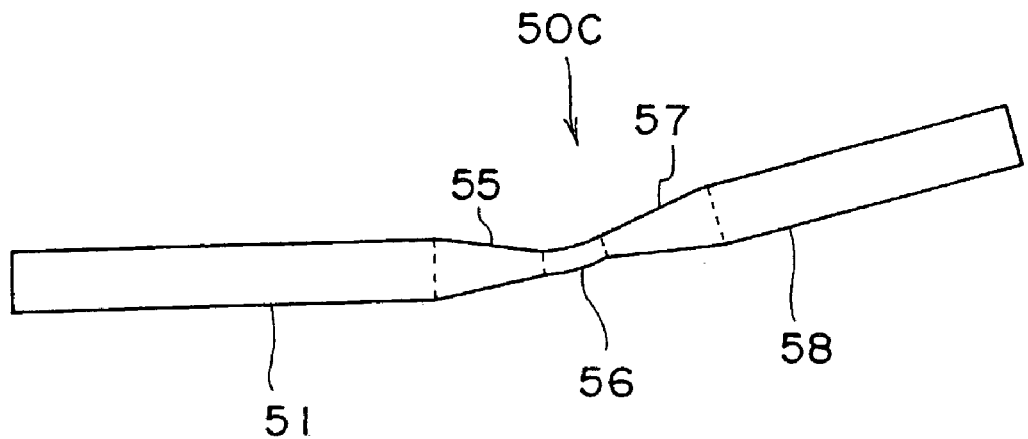
FIG. 12 is a plan view specifically showing the structure of a guided beam incident portion of the another optical waveguide.

FIG. 12 is a plan view specifically showing the structure of the guided beam incident portion 50C. The guided beam incident portion 50C includes the straight incidence area 51 where laser beams enter; a narrowing tapered incidence area 55 which constricts the incident laser beams entering from the straight incidence area 51; a curved area 56 which directs the laser beams which have passed through the narrowing tapered incidence area 55 towards the condensing point P; a widening tapered area 57 which collimates the laser beams which have passed through the curved area 56; and an intermediate straight area 58 which guides the laser beams, which have entered from the widening tapered area 57, to the guided beam exiting portion 60 at fixed propagation angles. The curved area 56 has a straight portion which is on a symmetrical axis of the guided beam incident portion 50C and a curved portion, an angle of the curve of which increases with an increase in distance from the symmetrical axis.

The optical waveguide device 40 having the above structure can multiplex laser beams more efficiently because the device constricts the incident laser beams in the narrowing tapered incidence area 55 and changes in the adjacent curved area 56 the propagation direction of the laser beams towards the condensing point P. A guided beam incident portion 50D, which will be described below, may be used instead of the guided beam incident portion 50C.

Figure 13:
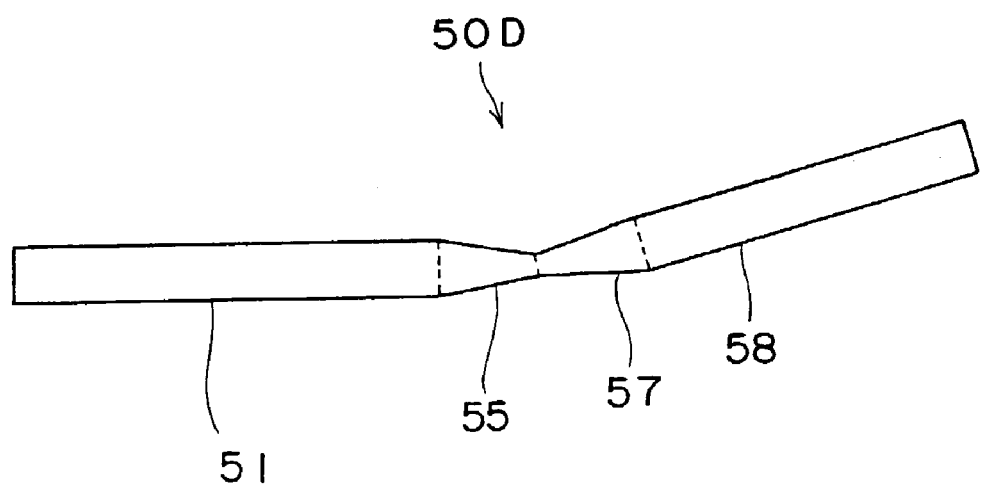
FIG. 13 is a plan view showing the structure of a guided beam incident portion.
Figure 14:
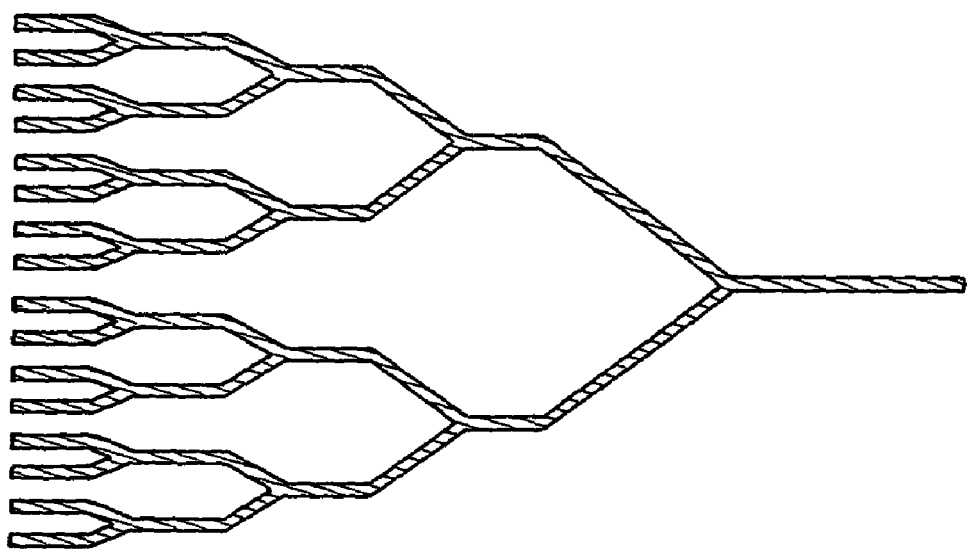
FIG. 14 is a plan view of a conventional Y-type multiplexing circuit.

FIG. 13 is a plan view showing the structure of the guided beam incident portion 50D. The guided beam incident portion 50D has the same structure as the guided beam incident portion 50C except that the guided beam incident portion 50D has no curved area 56. The guided beam incident portion 50D is easily curved because a juncture of the narrowing tapered incidence area 55 and the widening tapered area 57 is thin. The juncture of the narrowing tapered incidence area 55 and the widening tapered area 57 is curved so that the widening tapered area 57 is directed towards the condensing point P. With this structure, the guided beam incident portion 50D can direct diode laser beams towards the condensing point P without the curved area 56.

OTHER EMBODIMENTS

In the above embodiments, the optical waveguide device 40 has the step-index structure and includes $SiO_2$ as the cladding material and $SiO_2$ with $GeO_2$ added thereto as the core material. However, the optical waveguide device 40 may include other optical materials and have a graded-index structure in view of the distribution of refractive indices.

Further, in the above embodiments, the semiconductor laser arrays 20 are connected to the optical waveguide device 40 via the rod lens 30. However, the semiconductor laser arrays 20 may be connected to the optical waveguide device 40 by simple butting. Moreover, the light source used is not limited to the semiconductor laser array 20 emitting laser beams but may be an arrayed light source having a structure for controlling divergence angles of laser beams.

Furthermore, in the above embodiments, the optical waveguide device 40 has been described as an example of a device which multiplexes laser beams emitted from the semiconductor laser arrrays 20. However, an optical system such as an optical fiber having the same beam-guiding structure as the optical waveguide device 40 may also be used.

What is claimed is:

1. An optical circuit for condensing laser beams, said optical circuit comprising:
   a plurality of guided beam incident portions disposed about an axis, each of the guided beam incident portions comprising
   an incidence port through which laser beams enter and
   a waveguide for changing propagation angle which is optically connected to the incidence port and changes propagation angles of the incident laser beams, said waveguide having a curved portion, where an angle of the curved portion relative to the axis increases with an increase in distance of the incidence port from the axis; and
   a guided beam exiting portion comprising
   a first narrowing tapered portion, which has an inlet end optically connected to the plurality of guided beam incident portions and
   an outlet end and narrowingly tapers from the inlet end towards the outlet end,
   and
   an exit port provided at the outlet end of the first narrowing tapered portion,
   wherein, the waveguide for changing propagation angle includes a widening tapered portion which has an inlet end and an outlet end and narrowingly tapers from the outlet end towards the inlet end, the waveguide for changing propagation angle includes a second narrowing tapered portion which has an inlet end optically connected to the incidence port and an outlet end optically connected to the inlet end of the widening tapered portion and narrowingly tapers from the inlet end towards the outlet end, and the outlet end of the widening tapered portion is optically connected to the first narrowing tapered portion of the guided beam exiting portion.

2. The optical circuit for condensing laser beams of claim 1, wherein the waveguide for changing propagation angle includes a curved portion which is formed between the second narrowing tapered portion and the widening tapered portion and directs the incident laser beams in a direction in which the laser beams are condensed.

3. An optical circuit for condensing laser beams, said optical circuit comprising:

a plurality of guided beam incident portions disposed about an axis, each of the guided beam incident portions comprising an incidence port through which laser beams enter and a waveguide for changing propagation angle which is optically connected to the incidence port and changes propagation angles of the incident laser beams, said waveguide having a curved portion, where an angle of the curved portion relative to the axis increases with an increase in distance of the incidence port from the axis; and a guided beam exiting portion comprising a first narrowing tapered portion, which has an inlet end optically connected to the plurality of guided beam incident portions and an outlet end and narrowingly tapers from the inlet end towards the outlet end, and an exit port provided at the outlet end of the first narrowing tapered portion, wherein the waveguide for changing Propagation angle includes a widening tapered portion which has an inlet end and an outlet end and narrowingly tapers from the outlet end towards the inlet end, and wherein, given that θa is a divergence angle extended from the propagation angle of the laser beam at the outlet end of the widening tapered portion, $|\theta p|max$ (p=1, ..., N) is a maximum value of the propagation angles of the laser beams at the outlet ends of N number of the widening tapered portions, and θcr is a critical angle determined by the configuration and a refractive index characteristic of the narrowing tapered portion, a relationship of $|\theta a|<|\theta p|max<\theta cr$ (p=1, ..., N) is satisfied for at least (N−2) number of $|\theta p|max$.

4. An optical circuit for condensing laser beams, said optical circuit comprising:

a plurality of guided beam incident portions, each of the guided beam incident portions comprising an incidence port through which laser beams enter and a waveguide for changing propagation angle which is optically connected to the incidence port and changes propagation angles of the incident laser beams; and a guided beam exiting portion comprising a first narrowing tapered portion, which has an inlet end optically connected to the plurality of guided beam incident portions and an outlet end and narrowingly tapers from the inlet end towards the outlet end, and an exit port provided at the outlet end of the first narrowing tapered portion wherein:

the waveguide for changing propagation angle includes a widening tapered portion which has an inlet end and an outlet end and narrowingly tapers from the outlet end towards the inlet end, and the waveguide for changing propagation angle includes a second narrowing tapered portion which has an inlet end optically connected to the incidence port and an outlet end optically connected to the inlet end of the widening tapered portion and narrowingly tapers from the inlet end towards the outlet end; and the outlet end of the widening tapered portion is optically connected to the first narrowing tapered portion of the guided beam exiting portion.

5. The optical circuit for condensing laser beams of claim 4, wherein the waveguide for changing propagation angle includes a curved portion which is formed between the second narrowing tapered portion and the widening tapered portion and directs the incident laser beams in a direction in which the laser beams are condensed.

6. An optical circuit for condensing laser beams, said optical circuit comprising:

a plurality of guided beam incident portions, each of the guided beam incident portions comprising an incidence port through which laser beams enter and a waveguide for changing propagation angle which is optically connected to the incidence port and changes propagation angles of the incident laser beams; and a guided beam exiting portion comprising a first narrowing tapered portion, which has an inlet end optically connected to the plurality of guided beam incident portions and an outlet end and narrowingly tapers from the inlet end towards the outlet end, and an exit port provided at the outlet end of the first narrowing tapered portion wherein:

the waveguide for changing propagation angle includes a widening tapered portion which has an inlet end and an outlet end and narrowingly tapers from the outlet end towards the inlet end, and given that θa is a divergence angle extended from the propagation angle of the laser beam at the outlet end of the widening tapered portion, $|\theta p|max$ (p=1, ..., N) is a maximum value of the propagation angles of the laser beams at the outlet ends of N number of the widening tapered portions, and θcr is a critical angle determined by the configuration and a refractive index characteristic of the narrowing tapered portion, a relationship of $|\theta a|<|\theta p|max<\theta cr$ (p=1, ..., N) is satisfied for at least (N−2) number of $|\theta p|max$.

* * * * *